(12) United States Patent
Sugiyama et al.

(10) Patent No.: US 9,419,175 B2
(45) Date of Patent: Aug. 16, 2016

(54) SEMICONDUCTOR LIGHT EMITTING DEVICE

(71) Applicant: Kabushiki Kaisha Toshiba, Tokyo (JP)

(72) Inventors: Naoharu Sugiyama, Kanagawa-ken (JP); Shinji Yamada, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 113 days.

(21) Appl. No.: 13/779,978

(22) Filed: Feb. 28, 2013

(65) Prior Publication Data

US 2014/0138614 A1    May 22, 2014

(30) Foreign Application Priority Data

Nov. 22, 2012  (JP) ................................ 2012-256631

(51) Int. Cl.
*H01L 33/00* (2010.01)
*H01L 21/00* (2006.01)
(Continued)

(52) U.S. Cl.
CPC ............... *H01L 33/12* (2013.01); *B82Y 20/00* (2013.01); *H01L 33/32* (2013.01); *H01S 5/3201* (2013.01);
(Continued)

(58) Field of Classification Search
CPC .............. H01L 21/0254; H01L 21/02458; H01L 33/007; H01L 33/32; H01L 21/02381; H01L 33/12; H01L 33/0079; H01L 21/02502; H01L 21/02507; H01L 2224/32225; H01L 33/0075
USPC ............ 257/11, 77, 79, E21.127, 94, 13, 615; 438/47
See application file for complete search history.

(56) References Cited

U.S. PATENT DOCUMENTS 5,777,350 A *  7/1998  Nakamura et al. ............... 257/96
6,100,545 A *  8/2000  Chiyo et al. ..................... 257/98
(Continued)

FOREIGN PATENT DOCUMENTS

JP   10-145006 A    5/1998
JP   2007-123878 A  5/2007
(Continued)

OTHER PUBLICATIONS

Office Action issued Oct. 4, 2013, in Japanese Patent Application No. 2012-256631 with English translation.
(Continued)

*Primary Examiner* — Mary Wilczewski
*Assistant Examiner* — Tsz Chiu
(74) *Attorney, Agent, or Firm* — Oblon, McClelland, Maier & Neustadt, L.L.P.

(57) ABSTRACT

According to one embodiment, a semiconductor light emitting device includes: a first semiconductor layer of a first conductivity type; a second semiconductor layer of a second conductivity type; a light emitting layer; a conductive metal layer; and a first stress application layer. The first semiconductor layer contains a nitride semiconductor crystal and receives tensile stress in a (0001) plane. The second semiconductor layer contains a nitride semiconductor crystal. The light emitting layer has an average lattice constant larger than a lattice constant of the first semiconductor layer. The conductive metal layer has a thermal expansion coefficient larger than a thermal expansion coefficient of a nitride semiconductor crystal. The first stress application layer is provided between the second semiconductor layer and the light emitting layer. The first stress application layer relaxes tensile stress applied from the metal layer to the second semiconductor layer.

26 Claims, 10 Drawing Sheets

(51) Int. Cl.
*H01L 33/12* (2010.01)
*H01L 33/32* (2010.01)
*H01S 5/32* (2006.01)
*H01S 5/343* (2006.01)
*B82Y 20/00* (2011.01)
*H01S 5/02* (2006.01)
*H01S 5/022* (2006.01)

(52) U.S. Cl.
CPC ............ *H01S 5/34333* (2013.01); *H01S 5/021* (2013.01); *H01S 5/02236* (2013.01); *H01S 2301/173* (2013.01)

(56) References Cited

U.S. PATENT DOCUMENTS

| | | | | |
|---|---|---|---|---|
| 6,597,017 B1* | 7/2003 | Seko et al. | | 257/79 |
| 6,984,840 B2* | 1/2006 | Kuramata et al. | | 257/11 |
| 8,598,605 B2* | 12/2013 | Sugiyama | H01L 33/12 | 257/13 |
| 2003/0132448 A1* | 7/2003 | Tsujimura | B82Y 20/00 | 257/101 |
| 2007/0014324 A1* | 1/2007 | Maeda et al. | | 372/46.01 |
| 2007/0121690 A1* | 5/2007 | Fujii et al. | | 372/43.01 |
| 2009/0245310 A1* | 10/2009 | Miyake et al. | | 372/44.011 |
| 2010/0265981 A1* | 10/2010 | Hiroyama et al. | | 372/49.01 |
| 2011/0309400 A1* | 12/2011 | Fukushima et al. | | 257/98 |
| 2012/0007113 A1* | 1/2012 | Hwang et al. | | 257/94 |
| 2012/0146045 A1* | 6/2012 | Sugiyama et al. | | 257/76 |
| 2012/0223417 A1* | 9/2012 | Ishibashi et al. | | 257/615 |
| 2012/0261687 A1* | 10/2012 | Shim et al. | | 257/97 |
| 2013/0069107 A1* | 3/2013 | Nozaki et al. | | 257/103 |
| 2014/0138614 A1* | 5/2014 | Sugiyama et al. | | 257/13 |

FOREIGN PATENT DOCUMENTS

| | | |
|---|---|---|
| JP | 2011-166031 A | 8/2011 |
| JP | 2011-233936 A | 11/2011 |
| JP | 2012-43943 | 3/2012 |
| JP | 2012-060170 A | 3/2012 |

OTHER PUBLICATIONS

U.S. Appl. No. 13/601,454, filed Aug. 31, 2012, Naoharu Sugiyama et al.

Office Action issued May 16, 2013 in Japanese Patent Application No. 2012-256631 (with English-language translation).

* cited by examiner

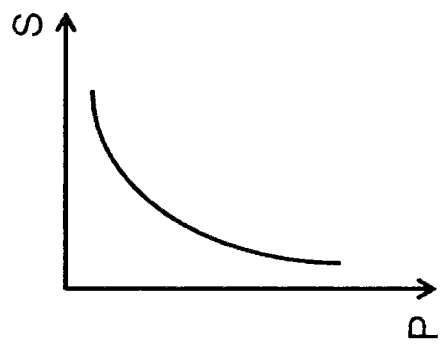
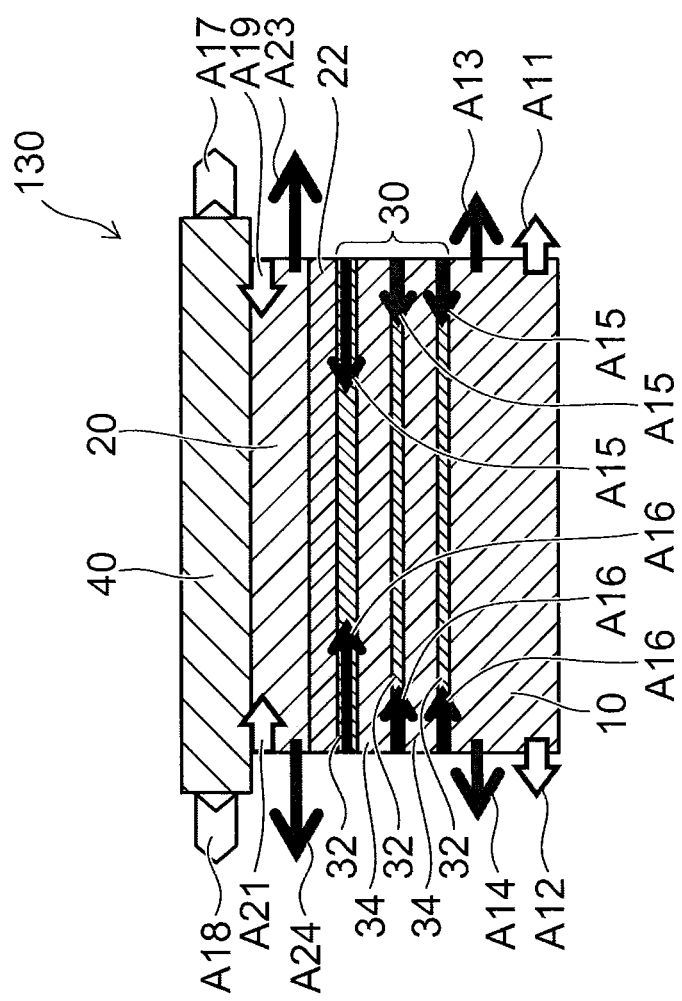
FIG. 6B
FIG. 6A

SEMICONDUCTOR LIGHT EMITTING DEVICE

CROSS-REFERENCE TO RELATED APPLICATIONS

This application is based upon and claims the benefit of priority from the prior Japanese Patent Application No. 2012-256631, filed on Nov. 22, 2012; the entire contents of which are incorporated herein by reference.

FIELD

Embodiments described herein relate generally to a semiconductor light emitting device.

BACKGROUND

Nitride semiconductors are used in semiconductor light emitting devices, and high performance devices are being put to practical use.

However, when a semiconductor light emitting device is formed by epitaxial growth of a nitride semiconductor crystal on a silicon substrate, which is less expensive and more efficient in manufacturing processes than a sapphire substrate, cracks, defects, etc. may be generated due to the tensile stress included in the epitaxial crystal layer.

When device operation at high current density is required, the temperature of the device becomes high, and cracks, defects, etc. due to the stress caused by thermal expansion may be generated. Such cracks and defects may degrade the device characteristics and in some cases may cause the device break down. It is desired to provide a semiconductor light emitting device with high light emission efficiency which suppresses the degradation in device characteristics and the operational malfunction resulting from the generation of cracks or the introduction of defects due to the tensile stress included in the crystal layer or the stress generated in high temperature operation.

BRIEF DESCRIPTION OF THE DRAWINGS

FIG. 6A and FIG. 6B are schematic diagrams showing the stress generated in another stacked structure;

DETAILED DESCRIPTION

Figure 1:
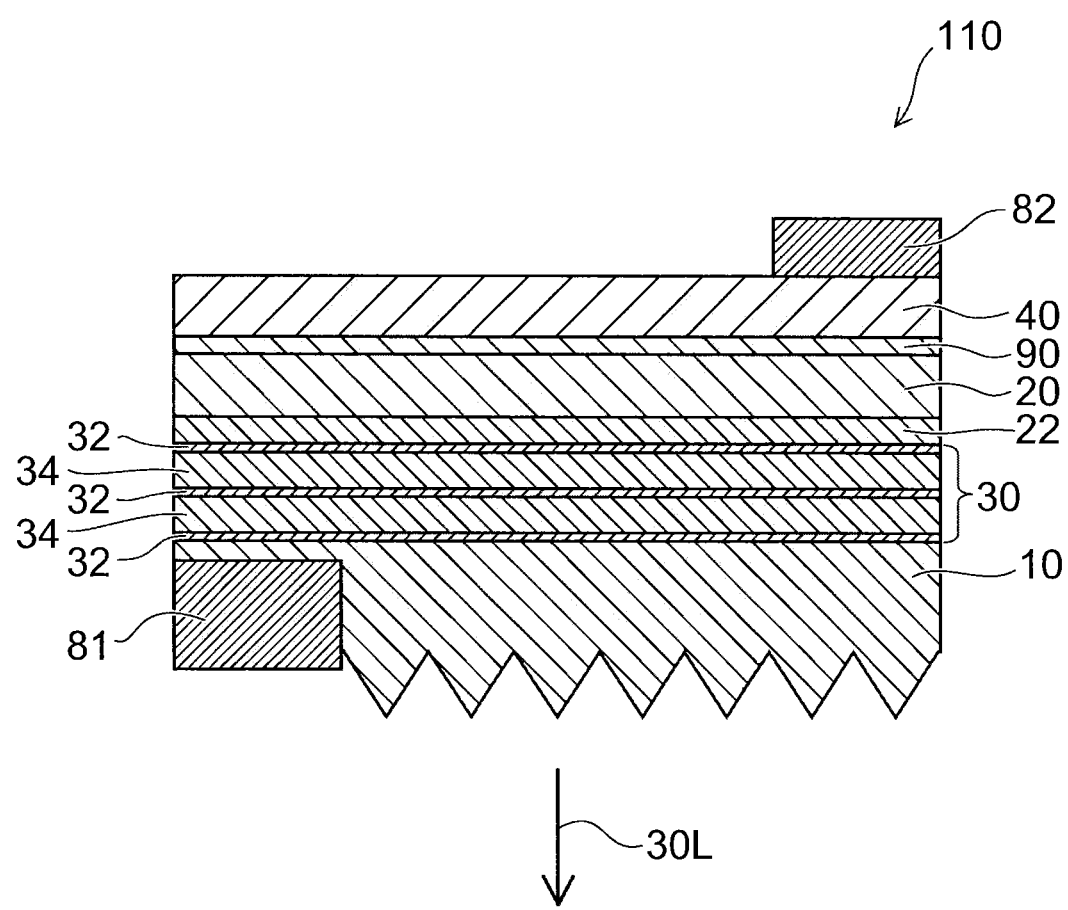
FIG. 1 is a schematic cross-sectional view illustrating a semiconductor light emitting device according to an embodiment.

In general, according to one embodiment, a semiconductor light emitting device includes: a first semiconductor layer of a first conductivity type; a second semiconductor layer of a second conductivity type; a light emitting layer; a conductive metal layer; and a first stress application layer. The first semiconductor layer contains a nitride semiconductor crystal and receives tensile stress in a (0001) plane. The second semiconductor layer contains a nitride semiconductor crystal. The light emitting layer is provided between the first semiconductor layer and the second semiconductor layer and contains a nitride semiconductor crystal. The light emitting layer has an average lattice constant larger than a lattice constant of the first semiconductor layer. The conductive metal layer is provided on an opposite side from the light emitting layer, on the second semiconductor layer. The conductive metal layer has a thermal expansion coefficient larger than a thermal expansion coefficient of a nitride semiconductor crystal. The conductive metal layer supports the first semiconductor layer, the light emitting layer, and the second semiconductor layer. The first stress application layer is provided between the second semiconductor layer and the light emitting layer. The first stress application layer relaxes tensile stress applied from the metal layer to the second semiconductor layer.

Hereinbelow, embodiments of the invention are described with reference to the drawings.

The drawings are schematic or conceptual; and the relationships between the thickness and width of portions, the proportions of sizes among portions, etc. are not necessarily the same as the actual values thereof. Further, the dimensions and proportions may be illustrated differently among drawings, even for identical portions.

In the specification of this application and the drawings, components similar to those described in regard to a drawing thereinabove are marked with the same reference numerals, and a detailed description is omitted as appropriate.

FIG. 1 is a schematic cross-sectional view illustrating the configuration of a semiconductor light emitting device according to an embodiment.

As shown in FIG. 1, a semiconductor light emitting device 110 according to the embodiment includes a first semiconductor layer 10 of a first conductivity type, a second semiconductor layer 20 of a second conductivity type, a light emitting layer 30, a first stress application layer 22, and a support substrate (a metal layer) 40. The semiconductor light emitting device 110 is, for example, an LED device. The semiconductor light emitting device 110 may be also a laser diode. In the following, a description is given using the case where the semiconductor light emitting device 110 is an LED.

An n-type semiconductor layer, for example, is used as the first semiconductor layer 10. A p-type semiconductor layer, for example, is used as the second semiconductor layer 20. However, the first semiconductor layer 10 may be the p type and the second semiconductor layer 20 may be the n type. In the following, a description is given using the case where the first semiconductor layer 10 is the n type and the second semiconductor layer 20 is the p type.

The first semiconductor layer 10 and the second semiconductor layer 20 contain a nitride semiconductor crystal. As described later, the first semiconductor layer 10 inherently has tensile strain (elastic expansion and contraction of the lattice spacing resulting from receiving stress) in the in-plane direction due to the stress applied from the outside (e.g. the static force applied to the crystal). That is, due to tensile stress being applied to the first semiconductor layer 10 in the in-plane direction, the lattice length (the lattice spacing in the actual crystal lattice) in the in-plane direction of the first semiconductor layer 10 has been made longer than the original lattice constant (the value determined as a physical constant) of the first semiconductor layer 10.

The first semiconductor layer 10 is, for example, an n-type GaN layer. The second semiconductor layer 20 is, for example, a p-type GaN layer. The first semiconductor layer 10 may include, for example, an i-GaN layer (hereinafter, also referred to as a "non-doped GaN layer") and an n-type GaN layer. The n-type GaN layer is laminated between the i-GaN layer and the second semiconductor layer 20.

The light emitting layer 30 is provided between the first semiconductor layer 10 and the second semiconductor layer 20. The light emitting layer 30 contains a nitride semiconductor crystal. The light emitting layer 30 contains a nitride semiconductor crystal having a lattice constant still larger than the lattice length in the in-plane direction of the first semiconductor layer 10 that has been expanded in the in-plane direction by receiving tensile stress.

The light emitting layer 30 includes, for example, a plurality of barrier layers 34 and a well layer 32 provided between barrier layers 34. The well layer 32 may be provided in plural. For example, the light emitting layer 30 has an MQW (multiple quantum well) structure.

The well layer 32 and the barrier layer 34 contain a nitride semiconductor crystal.

The well layer 32 contains a nitride semiconductor crystal having a lattice constant still larger than the lattice length in the in-plane direction of the first semiconductor layer 10 that has been expanded in the in-plane direction by receiving tensile stress.

The lattice in the in-plane direction of the well layer 32 includes compressive strain (elastic expansion and contraction of the lattice spacing) and has a lattice length smaller than the original lattice constant in the in-plane direction of the well layer 32, as a result of receiving compressive stress from the lattice of the first semiconductor layer 10 having a lattice length smaller than the lattice constant of the well layer 32.

The average lattice constant in the light emitting layer 30 is the lattice constant obtained by weighting by thickness distribution and averaging the lattice constant of the barrier layer 34 and the lattice constant of the well layer 32. The average lattice constant of the light emitting layer 30 is larger than the lattice constant of the first semiconductor layer 10. Furthermore, the average lattice constant of the light emitting layer 30 is larger than the lattice length in the in-plane direction of the first semiconductor layer 10 that has been expanded in the in-plane direction by receiving tensile stress.

The average lattice constant in the light emitting layer 30 may become larger from the first semiconductor layer 10 toward the second semiconductor layer 20 in the light emitting layer 30. Alternatively, the thicknesses of the plurality of well layers 32 in the light emitting layer 30 having an MQW structure may become thicker from the first semiconductor layer 10 toward the second semiconductor layer 20.

The first stress application layer 22 is provided between the second semiconductor layer 20 and the light emitting layer 30. The first stress application layer 22 contains a nitride semiconductor crystal. The lattice constant of the first stress application layer 22 is smaller than the lattice constant of the first semiconductor layer 10. The first stress application layer 22 relaxes the tensile stress applied from the support substrate 40.

The support substrate 40 is provided on one surface of the second semiconductor layer 20, on the opposite side to the light emitting layer 30. The support substrate 40 is a conductive metal layer. A metal such as copper, for example, is used for the support substrate 40. At least one of a reflection metal 90 and a bonding metal may be interposed between the support substrate 40 and the second semiconductor layer 20. In the semiconductor light emitting device 110 shown in FIG. 1, the reflection metal 90 is interposed between the support substrate 40 and the second semiconductor layer 20.

Figure 5:
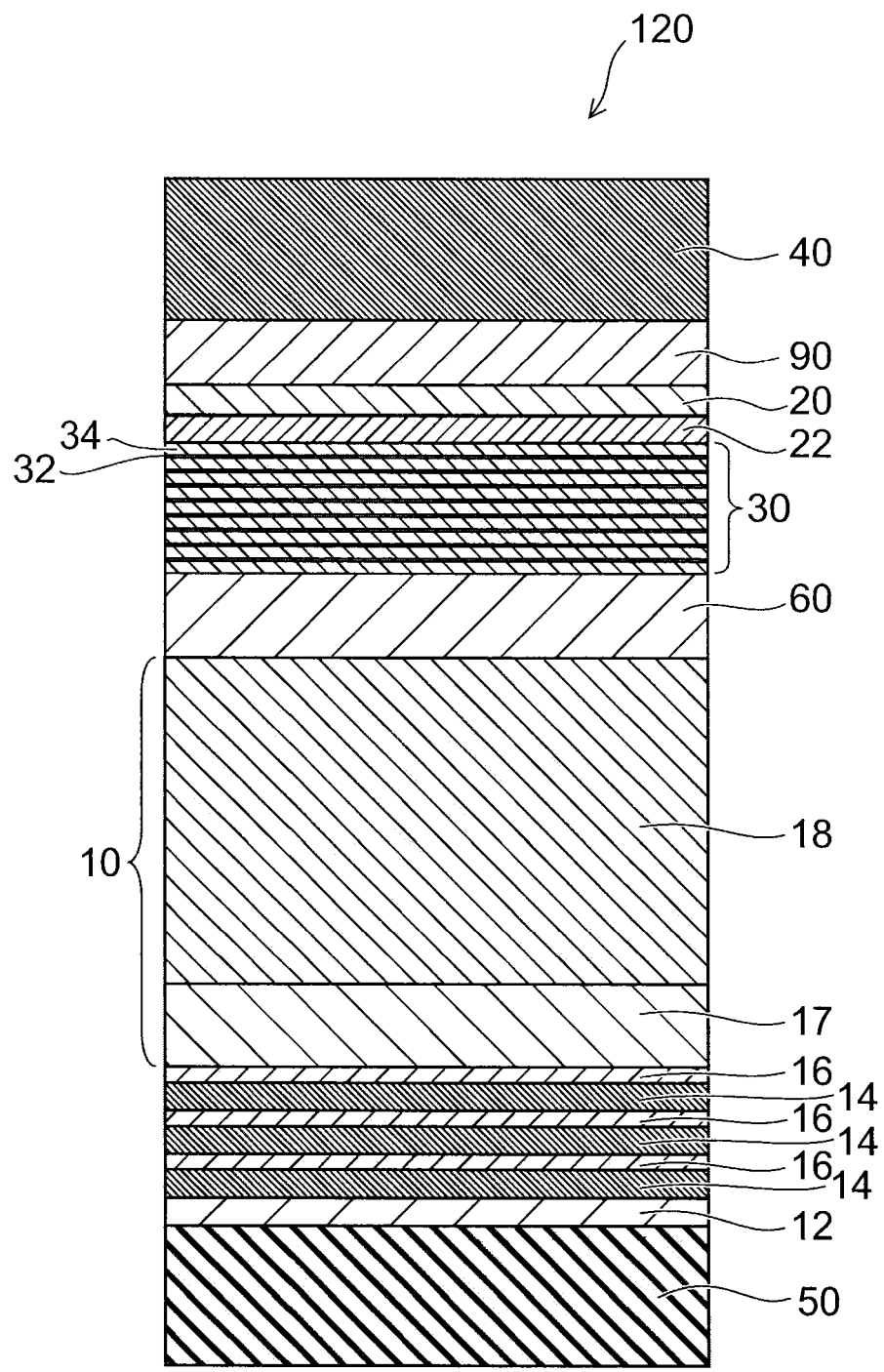
FIG. 5 is a schematic cross-sectional view showing an example of the crystal stacked structure when a semiconductor light emitting device according to the embodiment is fabricated.

The semiconductor light emitting device 110 may further include a second stress application layer 16 (see FIG. 5). The second stress application layer 16 is provided on the opposite side to the light emitting layer 30 from the first semiconductor layer 10. For example, the second stress application layer 16 contact with the first semiconductor layer 10. The second stress application layer 16 applies compressive stress to the first semiconductor layer 10, and thereby relaxes the tensile stress applied from the support substrate 40. The stress is described later.

The semiconductor light emitting device 110 further includes a first electrode 81, a second electrode 82, and the reflection metal 90. The support substrate 40 containing a metal such as copper is bonded to the LED stacked structure including the second semiconductor layer 20, the light emitting layer 30, and the first semiconductor layer 10 via the reflection metal 90 containing Ag on the second semiconductor layer 20 side and a bonding metal containing AuSn.

As illustrated by arrow 30L shown in FIG. 1, the light emitted from the light emitting layer 30 is emitted from the major surface (light extraction surface) on the first semiconductor layer 10 side. In other words, the light emitted from the light emitting layer 30 is emitted to the outside of the semiconductor light emitting device 110 via the first semiconductor layer 10. Thus, the major surface on the first semiconductor layer 10 side forms a light extraction surface. The light extraction surface may have undergone roughening processing. The LED stacked structure of nitride semiconductor crystals is formed between the second semiconductor layer 20 and the light extraction surface.

The first semiconductor layer 10 is made of, for example, an n-type gallium nitride (GaN) crystal. The light emitting layer 30 formed of a multiple-layer film of the well layer 32 and the barrier layer 34 is stacked on the first semiconductor layer 10. InGaN, for example, is used for the well layer 32. GaN, for example, is used for the barrier layer 34. The second semiconductor layer 20 is stacked on the quantum well structure of nitride semiconductors that forms the light emitting layer 30. The second semiconductor layer 20 is made of, for example, a p-type gallium nitride crystal.

In the specification of this application, "stack" includes not only the state where a plurality of layers are stacked in contact with one another but also the case where a plurality of layers are stacked via other layers.

In the specification of this application, being provided "on" includes not only the case where an upper layer is provided in contact with a lower layer but also the case where an upper layer is provided on a lower layer via another layer.

The lattice constant of the well layer 32 (e.g. an InGaN crystal layer) included in the light emitting layer 30 is larger than the lattice constant of the first semiconductor layer 10 (e.g. gallium nitride). The semiconductor light emitting device 110 has a structure in which a first nitride semiconductor crystal (e.g. the GaN crystal that forms the first semiconductor layer 10 and the second semiconductor layer 20) is used as matrices and a second nitride semiconductor crystal (the InGaN layer that forms the well layer 32) having a lattice constant larger than the lattice constant of the first nitride semiconductor crystal is placed between the matrices.

In the case where all of the first semiconductor layer 10, the light emitting layer 30, and the second semiconductor layer 20 are formed of a hexagonal crystal and are stacked in the c-axis direction, the a-axis length (the lattice length in the a-axis direction) of the lattice of the first semiconductor crystal layer is longer than the intrinsic a-axis length (the lattice constant in the a-axis direction) of the GaN crystal. That is, the first semiconductor crystal layer has tensile stress (elastic expansion and contraction of the lattice spacing) in the a-axis direction, as a result of the inherent tensile stress from the outside being applied. The average lattice constant in the a-axis direction of the lattice of the light emitting layer 30 (e.g. the stacked body of the well layer 32 of InGaN and the barrier layer 34 of GaN) is longer than the a-axis length of the lattice of the first semiconductor crystal. The average lattice constant in the a-axis direction of the lattice in the light emitting layer 30 may become larger from the first semiconductor layer 10 toward the second semiconductor layer 20 in the light emitting layer 30. The thicknesses of the plurality of well layers 32 in the light emitting layer 30 may become thicker from the first semiconductor layer 10 toward the second semiconductor layer 20. The magnitude of the tensile stress applied to the GaN layer can be investigated by Raman spectroscopy as described later.

The support substrate 40 is provided on the opposite side to the light emitting layer 30, on the second semiconductor layer 20. The support substrate 40 may be formed of copper or a metal containing copper. The thermal conductivity of the support substrate 40 is higher than the thermal conductivity of the nitride semiconductor crystal including the first semiconductor layer 10, the second semiconductor layer 20, and the light emitting layer 30. The thermal expansion coefficient of the support substrate 40 is larger than the thermal expansion coefficient of the nitride semiconductor crystal including the first semiconductor layer 10, the second semiconductor layer 20, and the light emitting layer 30.

Figure 2A:
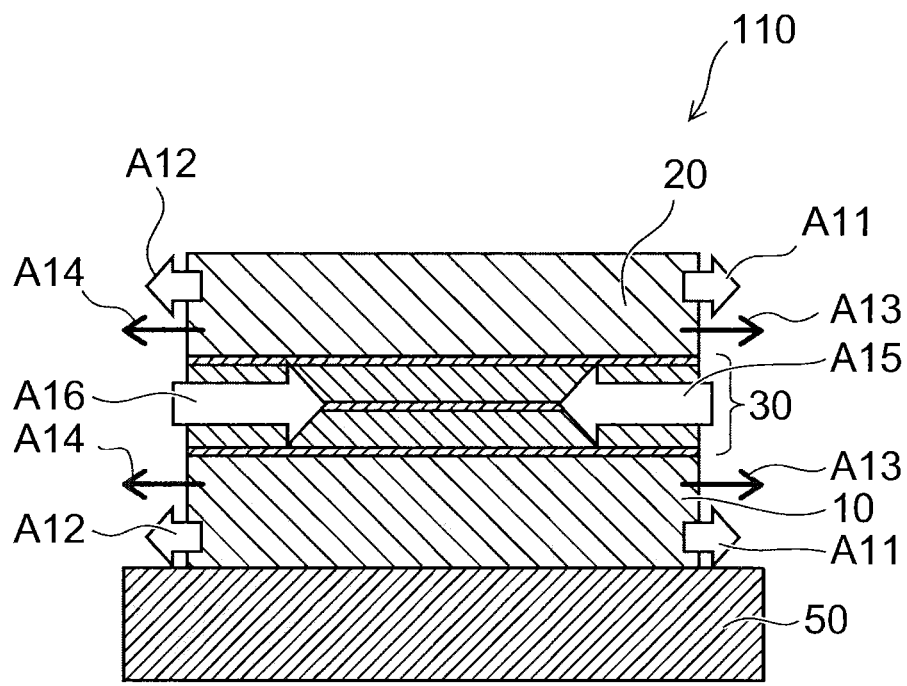
FIG. 2A and FIG. 2B are schematic cross-sectional views showing the stress generated in stacked structures.
Figure 2B:
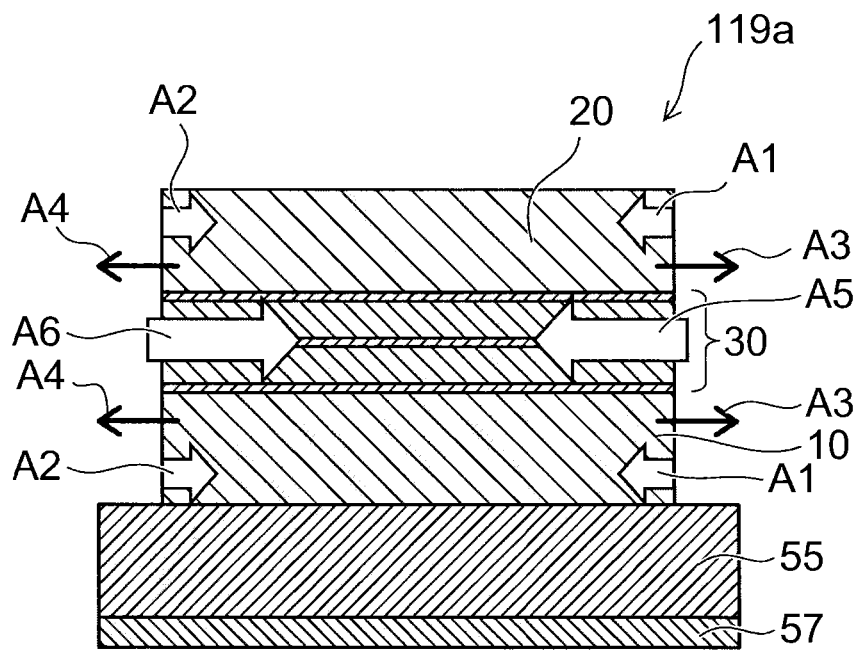
Figure 3A:
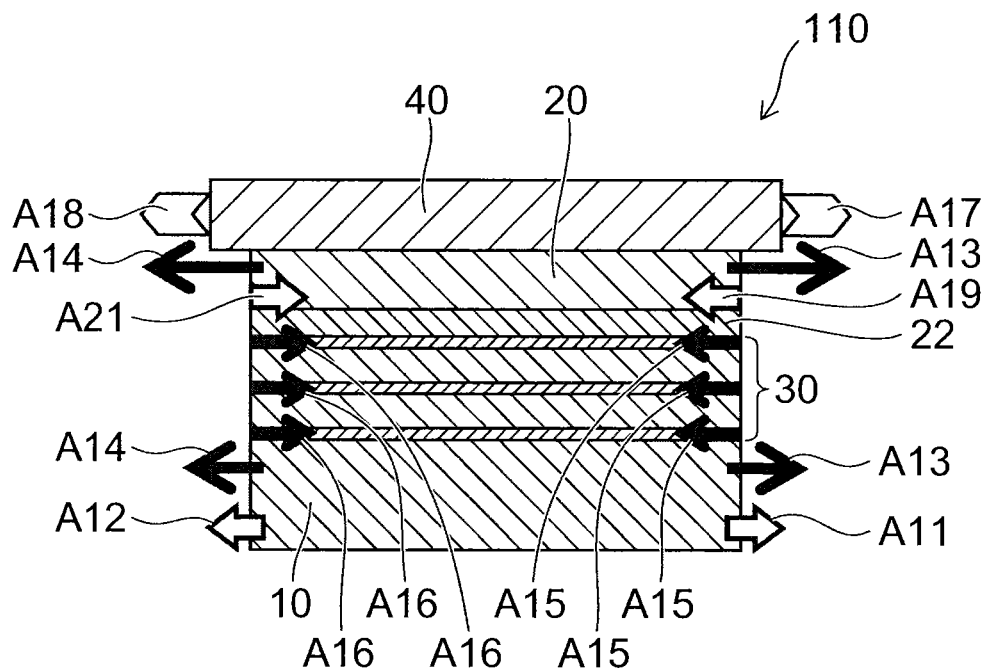
FIG. 3A and FIG. 3B are schematic cross-sectional views showing the stress generated in stacked structures including the support substrate.
Figure 3B:
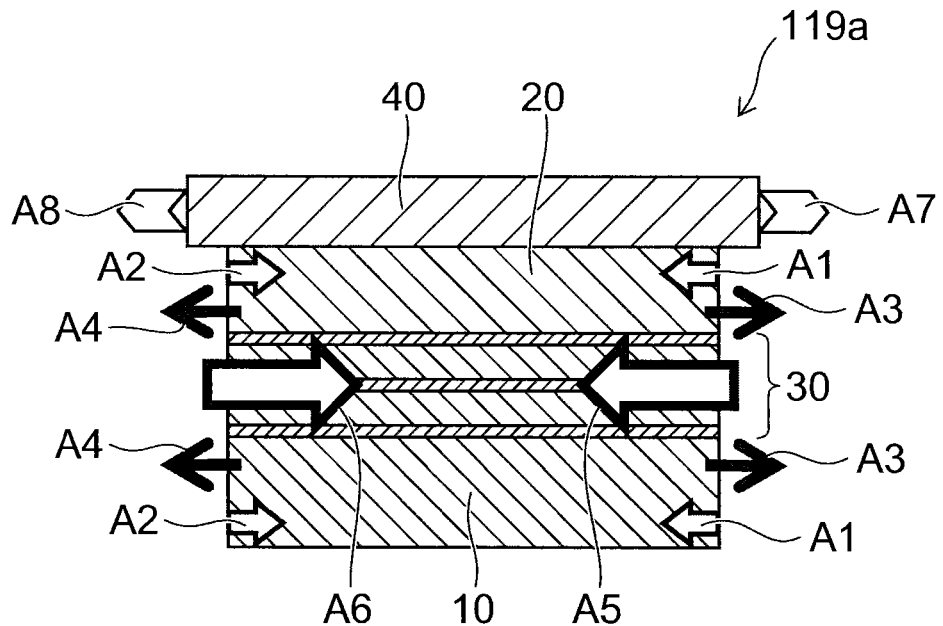

FIG. 2A and FIG. 2B are schematic cross-sectional views showing the stress generated in stacked structures. FIG. 3A and FIG. 3B are schematic cross-sectional views showing the stress generated in stacked structures including the support substrate.

Figure 4A:
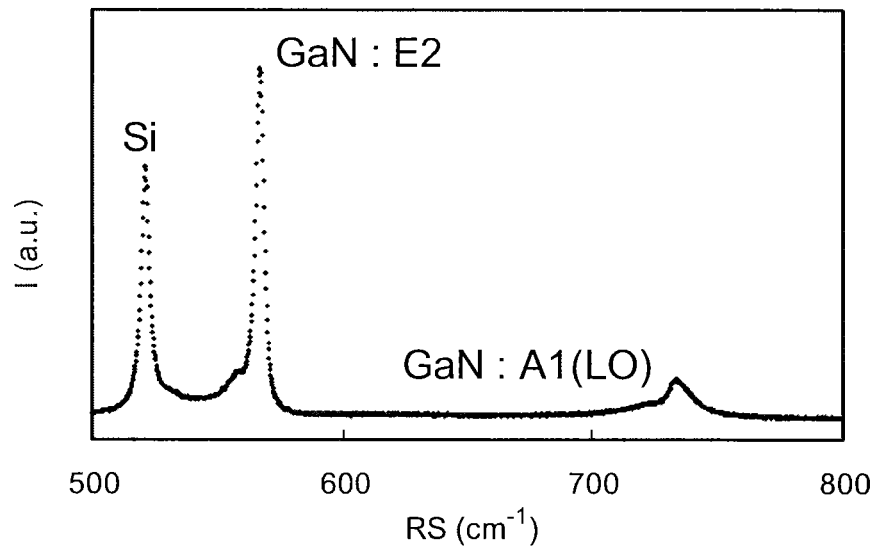
FIG. 4A and FIG. 4B are graphs showing the Raman spectra of gallium nitride crystals.
Figure 4B:
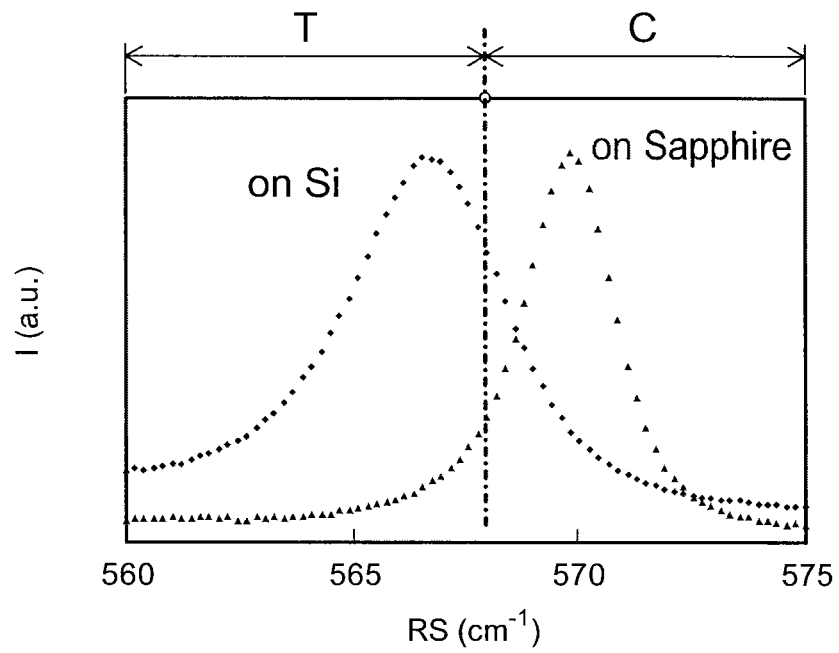

FIG. 4A and FIG. 4B are graphs showing the Raman spectra of gallium nitride crystals.

FIG. 2A and FIG. 3A illustrate the stress generated in the LED stacked structure of the semiconductor light emitting device according to the embodiment. FIG. 2B and FIG. 3B illustrate the stress generated in the LED stacked structure of a semiconductor light emitting device of a reference example. FIG. 4A is a graph showing the Raman spectrum of a gallium nitride crystal and a silicon crystal. FIG. 4B is a graph showing a comparison between the Raman spectrum of a nitride semiconductor crystal grown on a silicon substrate and the Raman spectrum of a nitride semiconductor crystal grown on a sapphire substrate. The vertical axis of FIG. 4A and FIG. 4B represents the intensity I (an arbitrary unit). The horizontal axis of FIG. 4A and FIG. 4B represents the wave number RS ($cm^{-1}$).

As shown in FIG. 2B, in a semiconductor light emitting device 119a according to the reference example, a gallium nitride crystal layer with a surface of the (0001) plane is formed on a sapphire substrate 55 having a surface of the (0001) plane, and further the light emitting layer 30 including an InGaN thin-film crystal layer is combined. Each semiconductor crystal of the semiconductor light emitting device 119a of the reference example formed on the sapphire substrate 55 with a surface of the (0001) plane is oriented in the c-axis direction.

A light emitting diode in which nitride semiconductor crystal layers are stacked on the sapphire substrate 55 like the semiconductor light emitting device 119a has a structure in which an n-type GaN layer (the first semiconductor layer 10), a quantum well light emitting layer (the light emitting layer 30), and a p-type GaN layer (the second semiconductor layer 20) are stacked on the sapphire substrate 55. The sapphire substrate 55 is almost transparent to the wavelength band of the blue color region. Thus, for example, a structure is employed in which a reflection film 57 is formed on the back surface of the sapphire substrate 55 and light is thereby extracted from the upper portion of the p-type GaN layer on the front surface side (the face-up structure).

In the LED using gallium nitride epitaxially grown on the sapphire substrate 55, the equivalent lattice length of the sapphire crystal serving for the lattice for the epitaxial growth of gallium nitride is smaller than the lattice constant of gallium nitride. The thermal expansion coefficient of the gallium nitride crystal is smaller than the thermal expansion coefficient of the sapphire crystal serving as the underlayer. Therefore, as illustrated by arrow A1 and arrow A2 shown in FIG. 2B, a large compressive stress is applied to the gallium nitride crystal layer when thin-film crystal growth at high temperature has been completed and the temperature has been lowered to room temperature. The gallium nitride crystal layer has compressive strain (elastic expansion and contraction of the lattice spacing). That is, the lattice length in the a-axis direction of the gallium nitride crystal layer epitaxially grown on the sapphire substrate 55 is shorter than the original lattice constant in the a-axis direction of the gallium nitride crystal.

The lattice constant of the InGaN crystal layer included in the light emitting layer 30 is larger than the lattice constant of gallium nitride. Therefore, as illustrated by arrow A3 and arrow A4 shown in FIG. 2B, stress in the drawing direction (tensile stress) is applied from the InGaN crystal layer to the gallium nitride crystal layer to which the compressive stress from the sapphire crystal has been applied. On the other hand, as illustrated by arrow A5 and arrow A6 shown in FIG. 2B, the light emitting layer 30 receives compressive stress from the gallium nitride crystal layer. Such compressive stress and tensile stress are, in other words, generated in the a-axis direction in the (0001) plane, for example.

Thus, the tensile stress applied to the gallium nitride crystal layer from the InGaN crystal layer having a lattice constant larger than the lattice constant of gallium nitride is relatively balanced with the compressive stress applied to the gallium nitride layer from the sapphire crystal. Therefore, there are few cases where defects are generated from the end surface of the n-type GaN layer, or the end surface of the p-type GaN layer, etc.

On the other hand, under operating conditions where current injection is increased for the purpose of higher light output, measures against heat generation are taken. To this end, for example as shown in FIG. 3B, a structure is employed in which an LED structure made of nitride semiconductors is epitaxially grown on the sapphire substrate 55, then the surface side of the p-type GaN layer is attached to the support substrate 40 with a high thermal conductivity, and the sapphire substrate 55 is peeled off (the thin-film structure).

In the thin-film structure, to promote the heat radiation in operation at high current density (high temperature operation), a metal such as copper may be used as the support substrate 40. In this case, the thermal expansion coefficient of a metal such as copper is generally larger than the thermal expansion coefficient of the nitride semiconductor crystal including the first semiconductor layer 10, the second semiconductor layer 20, and the light emitting layer 30.

Specifically, the thermal expansion coefficient of gallium nitride is $5.6 \times 10^{-6}$ $K^{-1}$. In contrast, the thermal expansion coefficient of copper is $16.8 \times 10^{-6}$ $K^{-1}$. That is, when the LED device of the thin-film structure using copper as the support substrate 40 is operated at high temperature, the support substrate 40 expands more than the nitride semiconductor crystal layer, as illustrated by arrow A7 and arrow A8 shown in FIG. 3B. Consequently, the nitride semiconductor crystal layer receives tensile stress from the support substrate 40.

Here, the findings by the inventors have revealed that the compressive strain due to the compressive stress applied to the gallium nitride crystal layer from the sapphire substrate 55 remains also in the thin-film structure from which the sapphire substrate 55 has been removed. That is, even after the sapphire substrate 55 is removed, the lattice length in the a-axis direction of the gallium nitride crystal layer is shorter than the original lattice constant in the a-axis direction of the gallium nitride crystal. That is, in the thin-film structure in which a crystal of an LED structure is grown on the sapphire substrate 55 and then the sapphire substrate 55 is removed, the compressive strain (elastic expansion and contraction of the lattice spacing resulting from receiving stress) that has remained in the interior of crystal is balanced also when the tensile stress from the support substrate 40 is applied in high temperature operation. Consequently, withstanding properties against the crack formation by the stress are high.

On the other hand, to utilize a substrate with a relatively large area, less expensive and more efficient in manufacturing processes than a sapphire substrate, it is attempted to grow a gallium nitride crystal on a silicon crystal.

As shown in FIG. 2A, the semiconductor light emitting device 110 according to the embodiment has an LED stacked structure that is formed on a silicon crystal with a surface of the (111) plane and includes an n-type GaN layer (the first semiconductor layer 10), a quantum well light emitting layer (the light emitting layer 30), and a p-type GaN layer (the second semiconductor layer 20) stacked. Each semiconductor crystal of the semiconductor light emitting device 110 formed on a silicon substrate 50 with a surface of the (111) plane is oriented in the c-axis direction.

The equivalent lattice length of the silicon crystal with a surface of the (111) plane for the lattice of epitaxial growth of gallium nitride is larger than the lattice constant in the a-axis direction of gallium nitride. The thermal expansion coefficient of the silicon crystal is smaller than the thermal expansion coefficient of gallium nitride. Therefore, as illustrated by arrow A11 and arrow A12 shown in FIG. 2A, a strong tensile stress is applied to the gallium nitride crystal layer after crystal growth is finished. The gallium nitride crystal layer has tensile strain (elastic expansion and contraction of the lattice spacing). Furthermore, as illustrated by arrow A13 and arrow A14 shown in FIG. 2A, the nitride semiconductor crystal system formed on the silicon crystal receives further tensile stress from the InGaN crystal layer. On the other hand, as illustrated by arrow A15 and arrow A16 shown in FIG. 2A, the light emitting layer 30 receives compressive stress from the gallium nitride crystal layer. Such compressive stress and tensile stress are, in other words, generated in the a-axis direction in the (0001) plane, for example.

Thus, in the semiconductor light emitting device 110 according to the embodiment, the tensile stress applied to the gallium nitride crystal layer from the InGaN crystal layer having a lattice constant larger than the lattice constant of gallium nitride synergizes with the tensile stress applied to the gallium nitride crystal layer from the silicon crystal. Therefore, in the case where a nitride semiconductor crystal is epitaxially grown on the silicon substrate 50 to form a semiconductor light emitting device, the tensile stress accumulated in the epitaxial crystal layer may not only cause elastic deformation (strain) of the crystal lattice but also generate cracks, defects, etc. as plastic deformation of the crystal. Consequently, obstruction may be caused in device fabrication processes and device operation, or the device characteristics may be degraded.

In the case where a nitride crystal grown on the silicon substrate 50 is used as a semiconductor light emitting device, the silicon substrate is generally not transparent to the wavelength of the light used. Hence, the thin-film structure is employed in which the grown layer is peeled off from the silicon substrate.

As described above, to promote the heat radiation during operation at high current density (high temperature operation), a metal such as copper and aluminum may be used as the support substrate 40. In this case, as described above, the thermal expansion coefficient of a metal having a high thermal conductivity, such as copper and aluminum, is generally larger than the thermal expansion coefficient of the nitride semiconductor crystal. When the LED device is operated at high temperature, the support substrate 40 expands more than the nitride semiconductor crystal layer, as illustrated by arrow A17 and arrow A18 shown in FIG. 3A. Consequently, the nitride semiconductor crystal layer receives tensile stress from the support substrate 40.

As described above, in the thin-film structure in which the growth substrate is peeled off from the gallium nitride crystal of the LED structure, the tensile stress (elastic expansion and contraction of the lattice spacing) generated by the stress that is accumulated in the nitride semiconductor crystal layer after the growth due to the difference between the lattice constant of the substrate and the lattice constant of the crystal layer or the difference between the thermal expansion coefficient of the substrate and the thermal expansion coefficient of the crystal layer remains even after the growth substrate is peeled off. In high temperature operation, the nitride semiconductor crystal layer receives not only the tensile stress that has remained in the interior of crystal, but also the tensile stress resulting from the difference between the thermal expansion coefficient of the support substrate 40 and the thermal expansion coefficient of the crystal layer. That is, in the case where an LED structure made of nitride semiconductor crystals is grown on the Si substrate 50, tensile strain (elastic expansion and contraction of the lattice spacing) is included in the GaN crystal layer. The lattice length in the a-axis direction of the GaN crystal is larger than the original lattice constant in the a-axis direction of the GaN crystal. Therefore, in the case where the support substrate 40 formed of a metal such as copper is used in the thin-film structure, in high temperature operation, the tensile stress resulting from the difference between the thermal expansion coefficient of the support substrate 40 and the thermal expansion coefficient of the crystal layer works synergistically with the tensile strain included in the crystal layer. Thereby, the risk of plastic deformation such as defects and cracks will be caused is increased in high temperature operation, and it results in characteristic degradation and device operational malfunction.

When the In composition ratio of the light emitting layer 30 is high and the average lattice length of the light emitting layer 30 is large, the tensile stress applied from the InGaN crystal layer to the gallium nitride crystal layer is large, and malfunction occurring in operation is significant. Also when the thickness of the InGaN crystal layer is thick, malfunction occurring in operation is significant.

In the case where the average lattice constant in the light emitting layer 30 becomes larger from the first semiconductor layer 10 toward the second semiconductor layer 20, a larger tensile stress is applied to the second semiconductor layer 20. Therefore, in the case where tensile stress is applied from the support substrate 40 to the second semiconductor layer 20, the risk of the formation of crystal defects and cracks is further increased. Specifically, in the case where the thicknesses of the plurality of InGaN well layers 32 in the light emitting layer 30 become thicker from the first semiconductor layer 10 toward the second semiconductor layer 20, a larger tensile stress is effectively applied to the second semiconductor layer 20. Thus, the tensile stress applied from the support substrate 40 works more synergistically.

In contrast, in the semiconductor light emitting device 110 according to the embodiment, as shown in FIG. 1 and FIG. 3A, the first stress application layer 22 is provided between the second semiconductor layer 20 and the light emitting layer 30. Thereby, the first stress application layer 22 relaxes the tensile stress applied from the support substrate 40.

The first stress application layer 22 includes, for example, an AlGaN layer. The first stress application layer 22 is not limited to including one AlGaN layer but may include a plurality of AlGaN layers.

By the semiconductor light emitting device 110 according to the embodiment, the first stress application layer 22 can relax the tensile stress applied from the support substrate 40 even under conditions where tensile strain remains in the first semiconductor crystal. Therefore, the formation of cracks or the introduction of defects in high temperature operation can be suppressed, and a semiconductor light emitting device with high light emission efficiency can be provided. Specifically, in the case where the support substrate 40 formed of a metal such as copper is used in the thin-film structure, even when tensile stress is generated in operation at high current density (in high temperature operation), the formation of cracks or the introduction of defects can be suppressed, and a semiconductor light emitting device with high light emission efficiency can be provided.

For example, in an device structure in which, as described in FIG. 2A, the support substrate 40 that applies tensile stress is further included in the thin-film crystal having tensile stress (the first semiconductor layer 10), the first stress application layer 22 for relaxing the tensile stress applied from the support substrate 40 is laminated. Therefore, the degradation in device characteristics resulting from the introduction of defects due to tensile stress can be suppressed.

Whether the stress applied to the gallium nitride crystal layer is compressive stress or tensile stress can be determined from a Raman spectrum. For example, the peak of the Raman spectrum of a gallium nitride crystal to which no stress is applied is at approximately 568 cm$^{-1}$, whereas the peak appears at a wave number RS smaller than 568 cm$^{-1}$, for example approximately 567.8 to 566 cm$^{-1}$, in a gallium nitride crystal to which tensile stress is applied, and the peak appears at a wave number RS larger than 568 cm$^{-1}$, up to approximately 575 cm$^{-1}$, in a gallium nitride crystal to which compressive stress is applied. According to the graph shown in FIG. 4B, it is found that a tensile stress of 0.1 to 0.15% is included in a GaN crystal layer grown on the silicon substrate 50.

FIG. 5 is a schematic cross-sectional view showing an example of the crystal stacked structure when a semiconductor light emitting device according to the embodiment is fabricated.

As shown in FIG. 5, in a semiconductor light emitting device 120 according to the embodiment, a buffer layer 12 (a layer that can form a second stress application layer described later) including an AlN layer and an AlGaN layer is laminated on the silicon substrate 50. An AlN layer (which plays a stress controlling layer during growth, and is to be the second stress application layer in the device.) 16 with a thickness of 15 nanometers (nm) is provided on the buffer layer 12 via a non-doped GaN layer 14 with a thickness of 300 nm. The first semiconductor layer 10 is stacked on the AlN layer 16. An n-type GaN layer 18 with a thickness of 2 micrometers (μm) and a non-doped GaN layer 17 with a thickness of 1 μm are stacked in the first semiconductor layer 10.

An SLS (super lattice structure) layer 60 having a structure in which a GaN layer with a thickness of 3 nm and an InGaN layer with an In content of 7% and a thickness of 1 nm are formed repeatedly 30 times is laminated on the n-type Gan layer 18. The MQW light emitting layer 30 is stacked on the SLS layer 60. The MQW light emitting layer 30 has a structure in which the barrier layer 34 with a thickness of 5 nm made of GaN and the well layer 32 formed of an InGaN layer with an In content of 15% and a thickness of 3 nm are formed repeatedly 8 times. In the semiconductor light emitting device 120 of the embodiment, the composition ratio of In in the well layer 32 is, for example, not less than 0.12 and not more than 0.20.

A p-type AlGaN layer (the first stress application layer 22) with an Al content of 20% is laminated on the light emitting layer 30. A p-type GaN layer (the second semiconductor layer 20) is laminated on the p-type AlGan layer (the first stress application layer 22). The reflection metal 90 is laminated on the p-type GaN layer (the second semiconductor layer 20).

The support substrate 40 of copper is attached onto the reflection metal 90 via a bonding metal. After the support substrate 40 is attached in accordance with the processes described later and an n electrode is formed, the silicon substrate 50 for epitaxial growth is peeled off; thus, the process is completed. Herein, differing from the semiconductor light emitting device 110 shown in FIG. 1, the second stress application layer 16 is interposed between the buffer layer 12 and the first semiconductor layer 10 (an n-type GaN layer). The second stress application layer 16 can be taken into the device by not removing but leaving the stress controlling layer during growth.

Here, as described above, the thermal expansion coefficient of gallium nitride is $5.6 \times 10^{-6}$ K$^{-1}$. In contrast, the thermal expansion coefficient of copper is $16.8 \times 10^{-6}$ K$^{-1}$. For the operation of a high power LED device, usually a current of 350 mA or more is passed. At this time, the temperature in the device may reach approximately 100° C. to 200° C. When the operating temperature is 200° C., the thermal expansion rate of gallium nitride is approximately 0.11%. In contrast, the thermal expansion rate of copper, which is the support substrate 40, is approximately 0.33%. The thermal expansion rate of copper, which is the support substrate 40, is approximately three times the thermal expansion rate of gallium nitride. That is, a tensile stress equivalent to the difference of 0.22% is applied to the gallium nitride crystal layer.

On the other hand, the lattice constant in the in-plane direction (the a-axis direction) of a GaN crystal is 0.518 nm. The lattice constant in the in-plane direction (the a-axis direction) of an AlN crystal is 0.498 nm. The difference between the lattice constant in the in-plane direction (the a-axis direction) of the GaN crystal and the lattice constant in the in-plane direction (the a-axis direction) of the AlN crystal is approximately 4%. Therefore, an AlGaN crystal with an Al content of approximately 5% (the lattice constant in the a-axis direction being approximately 0.517 nm, the mismatch factor to the GaN crystal being 0.2%) is suitable as the first stress application layer 22. However, considering that tensile strain may remain in the GaN crystal layer at a maximum of approximately 0.5 to 1.0%, the Al composition ratio of the AlGaN layer that forms the first stress application layer 22 may be as high as approximately 30%. The thickness of the first stress application layer 22 is set within a range of 5 to 20 nm.

With regard to the second stress application layer 16, since it is away from the bonding interface between the support substrate 40 of copper including the reflection metal and the p-type GaN layer 20 via the light emitting layer 30, an AlGaN layer with an Al content higher than the Al content of the first stress application layer 22 is suitable. That is, the lattice constant of the second stress application layer 16 is preferably smaller than the lattice constant of the first stress application layer 22. Specifically, an AlN crystal layer is preferable. The thickness of the second stress application layer 16 is set to 10 to 50 nm. The second stress application layer 16 may have a two-layer structure of an AlN layer and an AlGaN layer with an Al content of approximately 50% or less.

FIG. 6A and FIG. 6B are schematic diagrams showing the stress generated in another stacked structure.

FIG. 6A is a schematic cross-sectional view showing the configuration of the other stacked structure. FIG. 6B is a graph showing an example of the relationship between the position in the stacking direction and the internal stress. In the specification of this application, the "stacking direction" refers to the direction from the first semiconductor layer 10 toward the second semiconductor layer 20 or the direction from the second semiconductor layer 20 toward the first semiconductor layer 10.

In a semiconductor light emitting device 130, the thicknesses of the plurality of well layers 32 in the light emitting layer 30 having an MQW structure become thicker from the first semiconductor layer 10 toward the second semiconductor layer 20. Specifically, for example, the thicknesses of the well layers 32 other than the well layer 32 nearest to the p-type GaN layer out of the plurality of well layers 32 is 3 nm. In contrast, the thickness of the well layer 32 nearest to the p-type GaN layer is 5 nm. The thickness of the barrier layer 34 of the light emitting layer 30 is 5 nm. This is similar to the thickness of the barrier layer 34 of the semiconductor light emitting device 120 described above in regard to FIG. 5.

As shown by arrow A23 and arrow A24 shown in FIG. 6A and FIG. 6B, in the structure in which the width of the well layer 32 made of InGaN is wide, the tensile stress applied to the p-type GaN layer from the well layer 32 is relatively strong. The tensile stress applied to the p-type GaN layer from the well layer 32 is superposed with the tensile stress applied to the p-type GaN layer from the support substrate 40 of copper. Thereby, the frequency of crack formation in high temperature operation is increased. Therefore, the effect of the first stress application layer 22 made of an AlGaN crystal is more significant. In the case where, like this example, the average lattice constant becomes larger effectively from the n-type GaN layer (the first semiconductor layer 10) toward the p-type GaN layer (the second semiconductor layer 20) in the light emitting layer 30, the effect of the first stress application layer 22 is larger. However, in the case where the average lattice constant becomes larger on the p-type GaN layer side, the difference between the lattice constant of the first stress application layer 22 (an AlGaN layer) and the lattice constant of the well layer 32 is large, and the risk is increased that defects will occur at the interface between the light emitting layer 30 and the first stress application layer 22.

Figure 7:
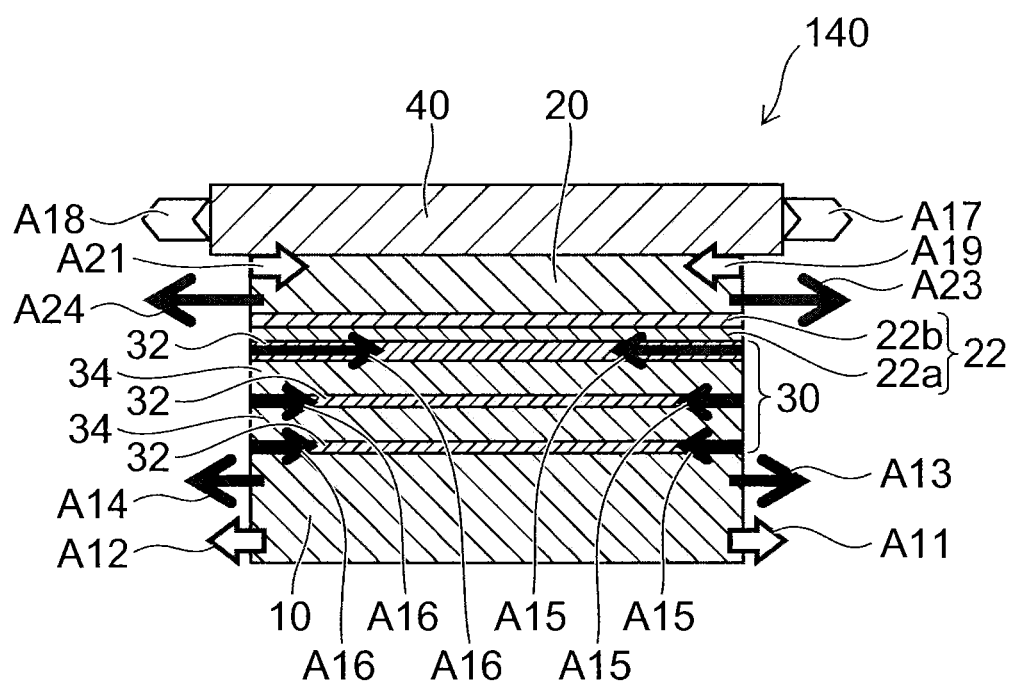
FIG. 7 is a schematic cross-sectional view showing the stress generated in a still another stacked structure.

FIG. 7 is a schematic cross-sectional view showing the stress generated in a still another stacked structure.

In a semiconductor light emitting device 140, similarly to the semiconductor light emitting device 130 described above in regard to FIG. 6A and FIG. 6B, the thicknesses of the plurality of well layers 32 in the light emitting layer 30 having an MQW structure become thicker from the first semiconductor layer 10 toward the second semiconductor layer 20.

In this case, as shown in FIG. 7, making the interior of the first stress application layer 22 to be a two-layer structure is one effective means. That is, an AlGaN layer with a relatively low Al content is used as a first stress application unit 22a on the side near to the light emitting layer 30. An AlGaN layer with a relatively high Al content is used as a second stress application unit 22b on the side near to the p-type GaN layer (the second semiconductor layer 20). Specifically, for example, the first stress application unit 22a on the side near to the light emitting layer 30 is formed to be an AlGaN layer with an Al content of 10% and a thickness of 10 nm. The second stress application unit 22b thereon on the side near to the p-type GaN layer is stacked to be an AlGaN layer with an Al content of 20% and a thickness of 10 nm. Here, the structure of the first stress application layer 22 is not limited to a two-layer structure of AlGaN layers. For example, the first stress application layer 22 may have a multiple-layer structure of three or more layers, or may have a structure with a continuously gradient composition ratio. A structure in which the lattice constant becomes smaller from the light emitting layer 30 toward the p-type GaN layer is more preferable.

Next, an example of the fabrication processes of the semiconductor light emitting device 120 described above in regard to FIG. 5 is described.

FIG. 8A to FIG. 10F are schematic cross-sectional views showing processes for fabricating the semiconductor light emitting device structure shown in FIG. 5.

First, the silicon substrate 50 with a surface of the (111) plane is prepared as a substrate for the crystal growth of a thin-film nitride semiconductor. The thickness of the crystal of the silicon substrate 50 is, for example, approximately 525 μm. However, the thickness of the crystal of the silicon substrate 50 is not limited thereto, and may be, for example, approximately 250 μm to 1000 μm.

In general, the surface of the Si substrate 50 placed in the air is coated with a native oxide. To epitaxially grow a nitride semiconductor crystal layer, it is necessary to remove the native oxide and reveal the silicon crystal surface. To this end, hydrofluoric acid treatment is performed on the silicon substrate 50 in order to perform hydrogen termination, which is a means to reveal the silicon crystal surface at relatively low temperature. Specifically, after acid washing treatment for removing the contaminants on the substrate surface is performed, the silicon substrate 50 is treated with a dilute hydrofluoric acid solution with a concentration of approximately 1% for about 1 minute. By this treatment, the surface of the Si layer becomes a hydrogen-terminated surface structure, which is a water-repellent surface. The hydrogen atoms covering the silicon crystal surface desorbs at a temperature of approximately 700° C. Thereby, a clean silicon crystal surface can be obtained. On the other hand, as another means for obtaining a clean silicon crystal surface, there is a method in which a silicon crystal substrate with the surface covered with a thin native oxide is heat-treated at a high temperature of 1000° C. or more.

Herein, the Si substrate 50 of which the surface has been hydrogen-terminated is introduced into a film deposition apparatus (an MOCVD apparatus) using an organic metal and ammonia gas as the source material, and an AlN layer with a thickness of 100 nm is stacked at a film deposition temperature of 1200° C. Although an example in which an MOCVD apparatus is used for the film deposition of the AlN layer is described herein, the selection of the film deposition method is arbitrary. For example, also an ECR plasma sputtering apparatus, an MBE apparatus, etc. may be used as the film deposition apparatus of the AlN layer.

In the case where the film deposition of the AlN layer on the Si substrate 50 is performed by other than an MOCVD apparatus, after the film deposition of the AlN layer, the substrate is introduced into an MOCVD apparatus, and subsequently the film deposition processes below are performed.

After the AlN layer of 100 nm is stacked on the Si substrate 50, the substrate temperature is set to 1100° C. to stack an AlGaN layer with an Al content of 25% and a thickness of 250 nm.

The AlN layer and the AlGaN layer thus formed correspond to the buffer layer 12 shown in FIG. 5.

After that, a gallium nitride layer of 0.3 to 1.0 μm is formed using TMG (trimethylgallium) and NH$_3$ (ammonia) as the source material. After the gallium nitride layer 14 of 0.3 to 1.0 μm is stacked, the film deposition temperature is lowered to 700° C. to grow an AlN layer 16 with a thickness of 15 nm.

The AlN layer 16 functions as a stress controlling layer during growth. At this time, an AlGaN layer with a thickness of 50 nm and an Al content of 25% may be further stacked on the AlN layer 16. The AlN layer 16 or the stacked structure of the AlN layer 16 and the AlGaN layer may be used as the second stress application layer. Furthermore, the AlN layer 16 with a thickness of 15 nm serving as a stress controlling layer during growth may not be interposed, and an AlN layer that forms the buffer layer 12 (alternatively, the buffer layer 12 formed of a stacked structure of an AlN layer and an AlGaN layer) may be used as the second stress application layer.

Subsequently, an n-type GaN (the first semiconductor layer) 10 is stacked. At this time, in the n-type GaN 10, Si is adoped as an impurity with a concentration of $1\times10^{19}$ cm$^{-2}$. Here, as shown in FIG. 5, the n-type GaN 10 may not be formed directly on the AlN layer 16, but a intermediate layer (non-doped barrier layer) 17 containing no impurity may be grown with a thickness of approximately 1 to 3 μm and then an n-type GaN layer 18 may be stacked. In other words, the first semiconductor layer 10 may have a structure in which the non-doped GaN layer 17 and the n-type GaN layer 18 are stacked.

After the n-type GaN 10 is grown, the SLS layer 60 formed of a multiple-layer film of InGaN and GaN and the light emitting layer (MQW light emitting layer) 30 are stacked on the n-type gallium nitride crystal layer 10. To perform current injection to the light emitting layer 30 to emit light, the upper portion of the crystal structure is doped with a p-type impurity (Mg). At this time, an AlGaN layer (the first stress application layer 22) with an Al content of 20% and a thickness of 150 nm and p-type GaN (the second semiconductor layer 20) not containing Al are formed on the light emitting layer 30.

Also the AlGaN layer may be doped with a p-type impurity (Mg). The doping concentration of Mg is preferably a concentration in a range of $1\times10^{19}$ to $1\times10^{20}$ cm$^{-2}$. However, in the case where a Mg doping layer is formed by the MOCVD method, the doping concentration changes due to the memory effect; therefore, a uniform doping profile is not necessarily obtained. Thus, the doping concentration of Mg is allowed to deviate from the range described above.

Although herein the chemical vapor deposition method (the MOCVD method) using an organic metal is given as the method for the thin-film crystal growth of the n-type GaN crystal layer 10, the light emitting layer 30, the first stress application layer 22, and the p-type GaN 20, the method is not limited thereto. As the method for the thin-film crystal growth of the n-type GaN crystal layer 10, the light emitting layer 30, the first stress application layer 22, and the p-type GaN 20, any method such as the molecular beam epitaxy (MBE) method and the hydride vapor phase epitaxy (HVPE) method, which are thin-film crystal growth methods commonly used for nitride semiconductor crystal growth, may be used.

Figure 8A:
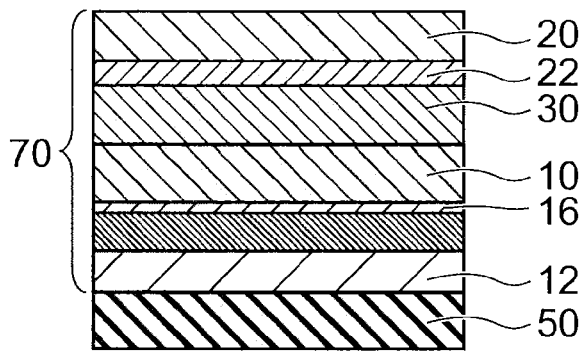
FIG. 8A to FIG. 8C are schematic cross-sectional views showing processes for fabricating the semiconductor light emitting device structure shown in FIG. 5.
Figure 8B:
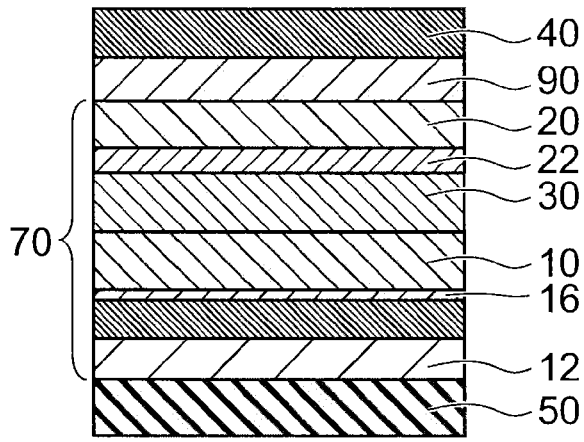

Thus, as shown in FIG. 8A, a thin-film crystal layer (a crystal growth layer) 70 of an LED structure can be epitaxially grown. After that, as shown in FIG. 8B, a metal film (the reflection metal 90) containing Ag functioning as both a reflection film and a contact layer, for example a silver nickel layer, is stacked on the surface of the second semiconductor layer 20, and then the workpiece is attached to the conductive support substrate 40 of copper or the like via a bonding metal (e.g. a gold-tin alloy (not shown)), with an intermediate layer (not shown) made of a metal material such as Ti, W, Pt, and Au interposed therebetween. The thickness of the support substrate 40 is preferably approximately 100 to 200 μm. An electrode is formed on the reflection metal 90 (or a bonding metal further stacked, or the support substrate 40); thereby, a p-side electrode can be formed.

Figure 8C:
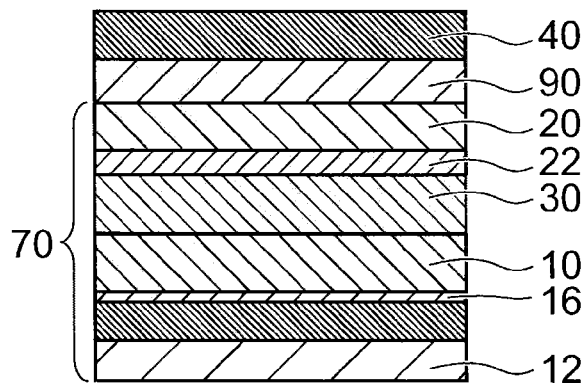

Next, the formation of an n-side electrode is described. As shown in FIG. 8C, the Si substrate 50, which is a substrate for thin-film crystal growth, is removed. The support substrate 40 is attached to the second semiconductor layer 20 side, and then the growth substrate is ground; thereby, the Si substrate 50 for growth can be removed. At this time, after the Si substrate 50 is almost removed by grinding, finally the small amount of residual Si is removed by dry etching using SF$_6$ gas as an etchant; thereby, the AlN layer (the buffer layer 12) formed on the Si substrate 50 at the beginning can be revealed.

Here, the AlN layer has the property of increasing the amount of resistance components. Therefore, for example in a semiconductor light emitting device having the stacked structure described above in regard to FIG. 5, there is an example in which the AlN-based buffer layer (e.g. the buffer layer 12 including an AlN layer) and the AlN-based stress controlling layer during growth are removed to reveal the n-type GaN layer 18 and then an n-side electrode is provided.

Specifically, in terms of electrode formation, the AlN-based buffer layer or the AlN layer has a high contact resistance. In addition, the amount of series resistance components is increased. Therefore, in common processes, the AlN-based buffer layer and the AlN-based stress controlling layer during growth in the electrode formation portion are removed to reveal the n-type GaN layer in the portion where the n-side electrode (the first electrode 81) will be formed.

Figure 9A:
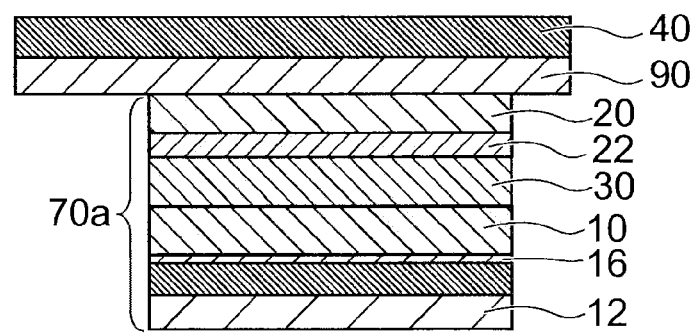
FIG. 9A to FIG. 9D are schematic cross-sectional views showing processes for fabricating the semiconductor light emitting device structure shown in FIG. 5.
Figure 9B:
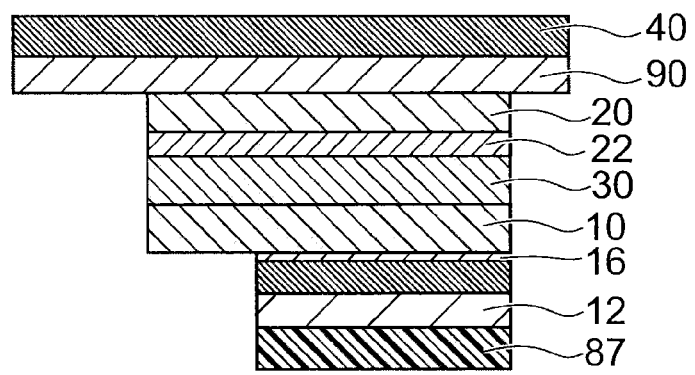
Figure 9C:
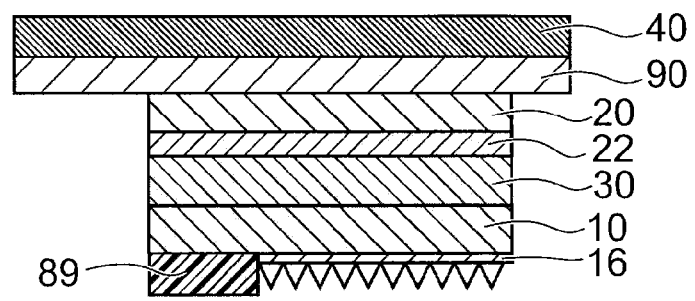

On the other hand, in the following example, a description is given including the case where, while the buffer layer 12 is removed, the AlN-based stress controlling layer during growth is utilized as the second stress application layer. As shown in FIG. 9A, the crystal growth layer 70 is divided with the size of the device. At this time, the substrate side below the metal of a p-type electrode (the second electrode 82) is kept in the state of not being divided. Subsequently, as shown in FIG. 9B, portions other than the portion where an n-side electrode (the first electrode 81) will be formed are protected by a mask 87, and the portion from the buffer layer 12 to the stress controlling layer during growth is removed by etching to reveal the first semiconductor layer 10 (n-type GaN). After that, as shown in FIG. 9C, only the portion where the n-side electrode (the first electrode 81) will be formed is protected by a mask 89, and a KOH solution is used to perform roughening processing with a depth of approximately 500 nm on the nitride semiconductor surface (the first semiconductor layer 10) side. At this time, the AlN and the AlGaN layer (the buffer layer 12) revealed at the surface are removed by etching. The AlN-based stress controlling layer during growth included in the crystal growth layer 70 (the nitride semiconductor crystal layer unit 70a) is removed by the roughening processing of the nitride semiconductor surface. However, the AlN-based stress controlling layer during growth may not be removed but be used as the second stress application layer (see FIG. 9C).

Figure 9D:
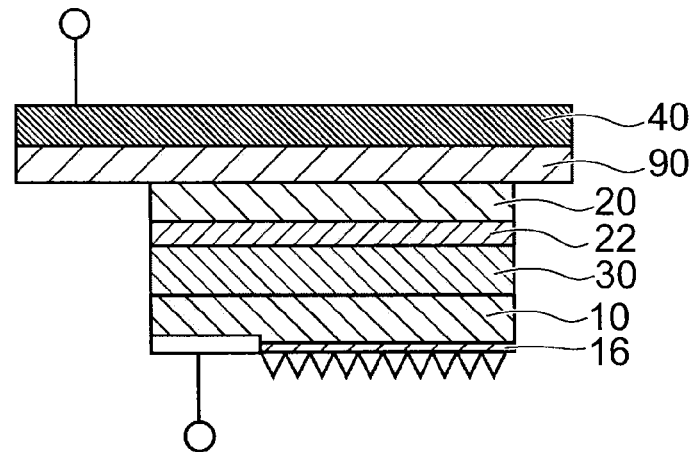

Finally, as shown in FIG. 9D, a p-type electrode and an n-type electrode are formed to complete the fabrication.

In the fabrication method described above, a sequence of forming the p-type electrode and the n-type electrode from both sides of the nitride semiconductor crystal layer is described. However, it is also possible to form both electrodes (the p-type electrode and the n-type electrode) on the opposite side to the light extraction surface. A specific fabrication method will now be described.

The process of epitaxial growth of a stacked structure of a nitride semiconductor thin-film crystal having an LED structure on the silicon substrate 50 with a surface of the (111) plane is similar to the above, and a description is therefore omitted. After the epitaxial growth of the nitride semiconductor thin-film crystal growth layer of an LED structure including a p-type GaN crystal layer at the surface is finished, first, a protection film 85 is formed on the entire surface of the p-type GaN layer. After that, an opening is partly provided, and etching processing is performed. By the etching processing, the p-type layer, the first stress application layer 22, and the light emitting layer 30 in the opening portion are etched to reveal the n-GaN layer 10 (see FIG. 10A). After that, as shown in FIG. 10B, an ohmic contact 83 made of Ti, Al, Ni, Au, or the like is formed on the revealed portion of the n-GaN layer.

After that, the protection film 85 covering the p-type GaN layer is removed, and a protection film 84 is formed on the n electrode formation portion. Further, the reflection metal 90 made of silver or an alloy containing silver as a main component is stacked on the surface of the p-type GaN layer. On the reflection metal 90, an intermediate layer (not shown) made of a metal such as, for example, Ti, W, Au, Pt, and Al is interposed and further a bonding metal (not shown) made of a gold-tin alloy is stacked. After that, the support substrate 40 made of a metal such as copper is attached (see FIG. 10C). The thickness of the support substrate is preferably approximately 100 to 200 µm.

Figure 10A:
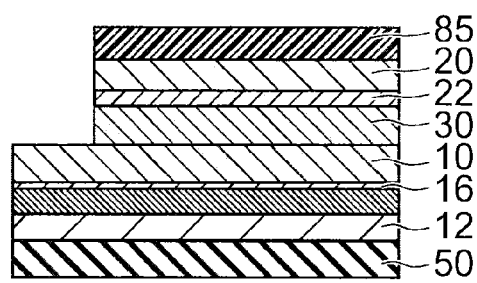
FIG. 10A to FIG. 10F are schematic cross-sectional views showing processes for fabricating the semiconductor light emitting device structure shown in FIG. 5.
Figure 10D:
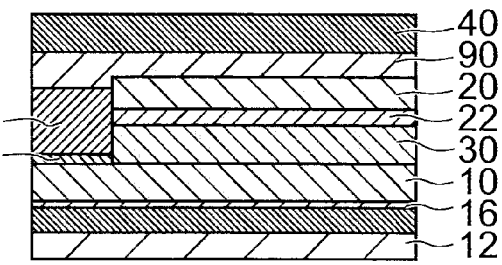
Figure 10B:
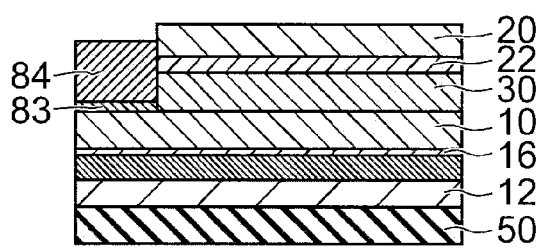
Figure 10E:
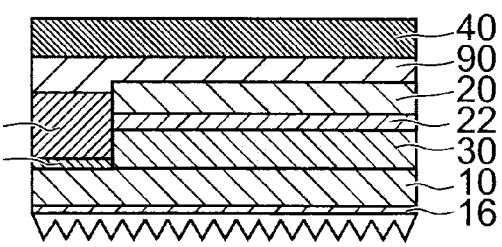
Figure 10C:
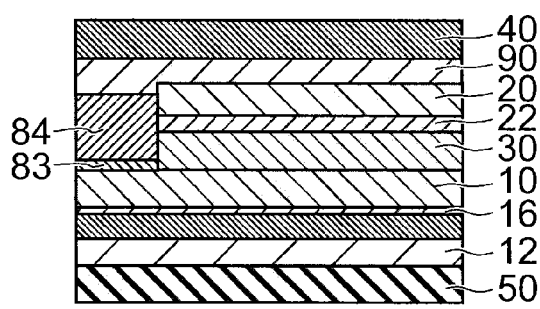
Figure 10F:
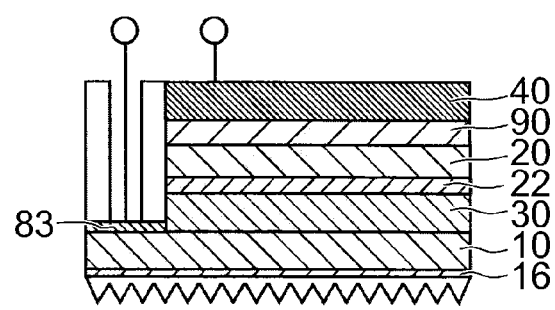

As shown in FIG. 10D, after the support substrate 40 is attached, the Si substrate 50 used for the epitaxial growth is peeled off to reveal the AlN buffer layer 12. After the AlN buffer layer is revealed, roughening processing is performed on the revealed surface. At this time, the AlN buffer layer is removed. Further, the AlN-based stress controlling layer during growth is removed. Alternatively, the AlN-based stress controlling layer during growth is not removed but used as the second stress application layer 16 (see FIG. 10E). In such device fabrication processes, there is no n-side electrode on the light extraction surface. Therefore, roughening processing can be performed on the entire surface.

After the roughening processing is finished, the n electrode portion of the support substrate 40 of copper is opened. Subsequently, an n extension electrode, which is insulated from the support substrate 40, is revealed and an interconnection of the n electrode is connected. The substrate 40 can be used as a p-side electrode (see FIG. 10F).

Here, as described above, in the case where the n electrode is formed from the n-GaN layer side, immediately after the growth of the thin-film crystal of an LED structure is finished, the support substrate 40 of copper is attached onto the flat p-GaN layer. In contrast, in the processes in which the n electrode is formed from the p-GaN layer side, the support substrate 40 of copper is attached onto the p-type GaN layer in which the n electrode portion is formed beforehand. That is, it is necessary to attach the support substrate 40 of copper to a surface partly having the unevenness caused by processing (not flat). At the time of the attachment, a bonding metal layer is interposed to follow the unevenness of the bonding surface. However, degradation in bonding conditions due to the formation of voids etc. is likely to occur as compared to attachment to a flat surface. To address the problem, also a method in which the support substrate 40 of copper is formed by a plating process, not attaching it as a plate-like substrate as described above, is one effective means.

Specifically, the preliminary processing of the formation of an n electrode and a p electrode is performed on a substrate in which a nitride semiconductor crystal layer of an LED structure is epitaxially grown on the silicon substrate 50. After that, the reflection metal 90 made of silver or containing silver as a main component and an intermediate layer made of a metal such as Ti, W, and Pt are stacked by the chemical vapor deposition method, the sputtering method, or the like. Subsequently, a seed layer containing Ti and Cu is stacked, and finally the plating method is used to form copper with a thickness of approximately 100 µm. When the support substrate 40 of copper is formed by the plating method, a structure with high adhesion to the unevenness of the electrode formation portion can be fabricated.

The material of the conductive support substrate 40 may be, in addition to copper (thermal conductivity: 370 to 380 $Wm^{-1}K^{-1}$, thermal expansion coefficient: $16.6 \times 10^{-6}$ $K^{-1}$), gold (thermal conductivity: 295 to 320 $Wm^{-1}K^{-1}$, thermal expansion coefficient: $14.2 \times 10^{-6}$ $K^{-1}$), silver (thermal conductivity: 418 $Wm^{-1}K^{-1}$, thermal expansion coefficient: $18.9 \times 10^{-6}$ $K^{-1}$), or the like. The material of the conductive support substrate 40 may be also aluminum (thermal conductivity: 200 to 230 $Wm^{-1}K^{-1}$, thermal expansion coefficient: $23.1 \times 10^{-6}$ $K^{-1}$). The material of the conductive support substrate 40 may be also an alloy of two or more of the metals mentioned above, an alloy using any of the metals mentioned above as a matrix, or the like. The conductive support substrate 40 may have a stacked film structure in which a layer of any of the metals, including alloys, mentioned above is used as a main layer and is combined with another material. That is, the support substrate 40 of the embodiment contains a metal selected from the group consisting of gold (Au), silver (Ag), copper (Cu), and aluminum (Al) or an alloy containing two or more selected from the group mentioned above.

In the specification, "nitride semiconductor" includes all semiconductors expressed by the chemical formula of $B_xIn_yAl_zGa_{1-x-y-z}N$ ($0 \le x \le 1$, $0 \le y \le 1$, $0 \le z \le 1$, $x+y+z \le 1$) in which the composition ratios x, y, and z are changed in the respective ranges. Furthermore, in the chemical formula mentioned above, also those further containing a group V device other than N (nitrogen), those further containing various devices added in order to control various properties such as the conductivity type, and those further containing various devices unintentionally contained are included in the "nitride semiconductor."

Hereinabove, embodiments of the invention are described with reference to specific examples. However, the invention is not limited to these specific examples. For example, one skilled in the art may appropriately select specific configurations of components of semiconductor light emitting devices such as light emitting layers and semiconductor layers from known art and similarly practice the invention. Such practice is included in the scope of the invention to the extent that similar effects thereto are obtained.

Further, any two or more components of the specific examples may be combined within the extent of technical feasibility and are included in the scope of the embodiments to the extent that the spirit of the embodiments is included.

Moreover, all semiconductor light emitting devices practicable by an appropriate design modification by one skilled in the art based on the semiconductor light emitting devices described above as embodiments of the invention also are within the scope of the invention to the extent that the purport of the embodiments of the invention is included.

Furthermore, various modifications and alterations within the spirit of the invention will be readily apparent to those skilled in the art.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor light emitting device comprising:
   a metal layer being conductive;
   a first semiconductor layer of a first conductivity type containing a GaN crystal and receiving tensile stress in a (0001) plane;
   a second semiconductor layer of a second conductivity type, the second semiconductor layer being provided between the metal layer and the first semiconductor layer and containing a GaN crystal;
   a reflecting metal provided between the metal layer and the second semiconductor layer, the reflecting metal having direct connection with the second semiconductor layer;
   a light emitting layer provided between the first semiconductor layer and the second semiconductor layer, the light emitting layer containing a nitride semiconductor crystal; and
   a third semiconductor layer provided between the second semiconductor layer and the light emitting layer and relaxing tensile stress applied from the metal layer to the second semiconductor layer, the third semiconductor layer containing AlGaN crystal,
   the metal layer having a thermal expansion coefficient larger than a thermal expansion coefficient of the nitride semiconductor crystal,
   the first semiconductor layer having a first face and a second face, the first face facing the light emitting layer, the second face being opposite to the first face, and
   a light emitted from the light emitting layer being extracted through the second face.

2. The device according to claim 1, wherein an average lattice constant of the light emitting layer becomes larger from the first semiconductor layer toward the second semiconductor layer.

3. The device according to claim 1, wherein the light emitting layer includes:
   a plurality of barrier layers; and
   a plurality of well layers each provided between adjacent ones of the plurality of barrier layers and thicknesses of the plurality of well layers become larger from the first semiconductor layer toward the second semiconductor layer.

4. The device according to claim 1, wherein
   the third semiconductor layer includes a plurality of layers with different lattice constants, and
   the lattice constants of the plurality of layers become larger from the second semiconductor layer toward the light emitting layer.

5. The device according to claim 1, further comprising a fourth semiconductor layer,
   the first semiconductor layer being provided between the light emitting layer and the fourth semiconductor layer,
   the fourth semiconductor layer applying compressive stress to the first semiconductor layer.

6. The device according to claim 5, wherein a lattice constant of the fourth semiconductor layer is smaller than a lattice constant of the third semiconductor layer.

7. The device according to claim 1, wherein the light emitting layer contains InGaN.

8. The device according to claim 1, wherein the metal layer contains a metal selected from the group consisting of gold (Au), silver (Ag), copper (Cu), and aluminum (Al) or an alloy containing two or more selected from the group.

9. The device according to claim 5, wherein the fourth semiconductor layer contains AlN.

10. The device according to claim 9, wherein the fourth semiconductor layer contains AlGaN.

11. The device according to claim 1, wherein the light emitting layer has an average lattice constant larger than a lattice constant of the first semiconductor layer.

12. The device according to claim 1, wherein a thickness of the conductive metal layer is not less than 100 μm.

13. The device according to claim 1, wherein the second face includes roughened surface.

14. A semiconductor light emitting device comprising:
   a metal layer being conductive;
   a first semiconductor layer of a first conductivity type containing a GaN crystal and having tensile strain in a (0001) plane;
   a second semiconductor layer of a second conductivity type, the second semiconductor layer being provided between the metal layer and the first semiconductor layer and containing a GaN crystal;
   a reflecting metal provided between the metal layer and the second semiconductor layer, the reflecting metal having direct connection with the second semiconductor layer;
   a light emitting layer provided between the first semiconductor layer and the second semiconductor layer, the light emitting layer containing a nitride semiconductor crystal; and
   a third semiconductor layer provided between the second semiconductor layer and the light emitting layer, containing a AlGaN crystal, and having a lattice constant smaller than a lattice constant of the first semiconductor layer,
   the conductive metal layer having a thermal expansion coefficient larger than a thermal expansion coefficient of the nitride semiconductor crystal,
   the first semiconductor layer having a first face and a second face, the first face facing the light emitting layer, the second face being opposite to the first face, and
   a light emitted from the light emitting layer being extracted through the second face.

15. The device according to claim 14, wherein an average lattice constant of the light emitting layer becomes larger from the first semiconductor layer toward the second semiconductor layer.

16. The device according to claim 14, wherein the light emitting layer includes:
  a plurality of barrier layers; and
  a plurality of well layers each provided between adjacent ones of the plurality of barrier layers and
  thicknesses of the plurality of well layers become larger from the first semiconductor layer toward the second semiconductor layer.

17. The device according to claim 14, wherein
  the third semiconductor layer includes a plurality of layers with different lattice constants and
  lattice constants of the plurality of layers become larger from the second semiconductor layer toward the light emitting layer.

18. The device according to claim 14, further comprising a fourth semiconductor layer,
  the first semiconductor layer being provided between the light emitting layer and the fourth semiconductor layer, the fourth semiconductor layer applying compressive stress to the first semiconductor layer.

19. The device according to claim 18, wherein a lattice constant of the fourth semiconductor layer is smaller than a lattice constant of the third semiconductor layer.

20. The device according to claim 14, wherein the light emitting layer contains InGaN.

21. The device according to claim 14, wherein the metal layer contains a metal selected from the group consisting of gold (Au), silver (Ag), copper (Cu), and aluminum (Al) or an alloy containing two or more selected from the group.

22. The device according to claim 18, wherein the fourth semiconductor layer contains AlN.

23. The device according to claim 22, wherein the fourth semiconductor layer contains AlGaN.

24. The device according to claim 14, wherein the light emitting layer has an average lattice constant larger than a lattice constant of the first semiconductor layer.

25. The device according to claim 14, wherein a thickness of the conductive metal layer is not less than 100 µm.

26. The device according to claim 14, wherein the second face includes roughened surface.

* * * * *